United States Patent
Ahn

(10) Patent No.: US 8,144,493 B2
(45) Date of Patent: Mar. 27, 2012

(54) CAM CELL MEMORY DEVICE

(75) Inventor: Sung Hoon Ahn, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 288 days.

(21) Appl. No.: 12/633,303

(22) Filed: Dec. 8, 2009

(65) Prior Publication Data

US 2010/0142241 A1    Jun. 10, 2010

(30) Foreign Application Priority Data

Dec. 8, 2008    (KR) .......................... 10-2008-0123875

(51) Int. Cl.
*G11C 15/00*    (2006.01)
(52) U.S. Cl. .................. 365/49.1; 365/185.05; 711/108; 711/128
(58) Field of Classification Search .................. None
See application file for complete search history.

(56) References Cited

U.S. PATENT DOCUMENTS 4,064,494 A * 12/1977 Dickson et al. ............. 365/49.17
6,256,216 B1 * 7/2001 Lien et al. .................... 365/49.1
6,317,349 B1 * 11/2001 Wong ........................ 365/49.15

FOREIGN PATENT DOCUMENTS

KR    1020070045200 A    5/2007

OTHER PUBLICATIONS

Notice of Preliminary Rejection issued from Korean Intellectual Property Office on Jun. 28, 2010.

* cited by examiner

*Primary Examiner* — Tan T. Nguyen
(74) *Attorney, Agent, or Firm* — IP & T Group LLP

(57) ABSTRACT

A code address memory (CAM) cell memory device comprises a first storage unit comprising a first nonvolatile memory cell configured to output a power source voltage in response to a read voltage, and a second storage unit comprising a second nonvolatile memory cell configured to output a ground voltage in response to the read voltage.

22 Claims, 4 Drawing Sheets

CAM CELL MEMORY DEVICE

CROSS-REFERENCE TO RELATED APPLICATION

Priority to Korean patent application number 10-2008-0123875 filed on Dec. 8, 2008, the entire disclosure of which is incorporated by reference herein, is claimed.

BACKGROUND

One or more embodiments relate to a code address memory (CAM) cell memory device for semiconductor memory devices, etc.

A typical semiconductor memory device includes a nonvolatile memory device capable of storing data even if the supply of a power source voltage is stopped. As to a method of storing data based on whether a physical connection is established through fuses, this method raises a concern in that once data is stored, the data cannot be changed and, in particular, fuse cutting can be performed only in the wafer step.

To address such a concern, a CAM cell has been developed. The CAM cell can store data even if the supply of a power source voltage is stopped because it includes a nonvolatile memory cell. In a typical CAM cell, data is read during the power-up operation in which a power source voltage is applied to a chip. There is a desire for a CAM cell having stable data output during the read operation.

BRIEF SUMMARY

One or more embodiments relate to a CAM cell with an improved structure and a CAM cell memory device including the same.

In an aspect of this disclosure, a CAM cell memory device comprises a first storage unit comprising a first nonvolatile memory cell configured to output a power source voltage in response to a read voltage, and a second storage unit comprising a second nonvolatile memory cell configured to output a ground voltage in response to the read voltage.

In another aspect of this disclosure, a CAM cell memory device comprises an operation setting unit configured to output a power source voltage and a ground voltage in response to an operation control signal or in response to the operation control signal and a data signal, a first storage unit including a first nonvolatile memory cell configured to output the power source voltage to an output node in response to a read voltage, a second storage unit including a second nonvolatile memory cell configured to output the ground voltage to the output node in response to the read voltage, and an operation voltage generation unit configured to apply a program voltage or the read voltage to gates of the first and second nonvolatile memory cells. Here, the first and second nonvolatile memory cells are configured to store data according to the program voltage, and the power source voltage and the ground voltage outputted in response to the operation control signal and the data signal and to output the stored data according to the read voltage, and the power source voltage and the ground voltage outputted in response to the operation control signal.

In yet another aspect of this disclosure, a CAM cell memory device comprises an operation selection unit configured to output a data signal when a program operation is performed and output a predetermined voltage when a read operation is performed, in response to an operation control signal, a data latch unit configured to output the data signal and an inverted data signal to first and second nodes in response to the data signal and to output a power source voltage and a ground voltage to the first and second nodes in response to the predetermined voltage, and a CAM cell unit including a first storage unit and a second storage unit, wherein the first storage unit is coupled between the first node and an output node and includes a first nonvolatile memory cell, and the second storage unit is coupled between the second node and the output node and includes a second nonvolatile memory cell. Here, the first and second nonvolatile memory cells have threshold voltages that vary in response to the data signal and the inverted data signal when the program operation is performed.

In further yet another aspect of this disclosure, a CAM cell memory device comprises first and second nonvolatile memory cells with drains electrically coupled together, and an operation control circuit configured to apply a read voltage or a program voltage to gates of the first and second nonvolatile memory cells, a power source voltage or a ground voltage to a source of the first nonvolatile memory cell, and a ground voltage or a power source voltage to a source of the second nonvolatile memory cell, in response to an operation control signal. Here, the potentials of the drains of the first and second nonvolatile memory cells are configured to be determined in response to data stored in the first and second nonvolatile memory cells and the power source voltage and the ground voltage applied to the sources of the first and second nonvolatile memory cells.

DESCRIPTION OF EMBODIMENTS

Hereinafter, some embodiments of the present disclosure will be described in detail with reference to the accompanying drawings. The drawings are provided to allow those having ordinary skill in the art to understand the scope of the embodiments of the disclosure.

Figure 1A:
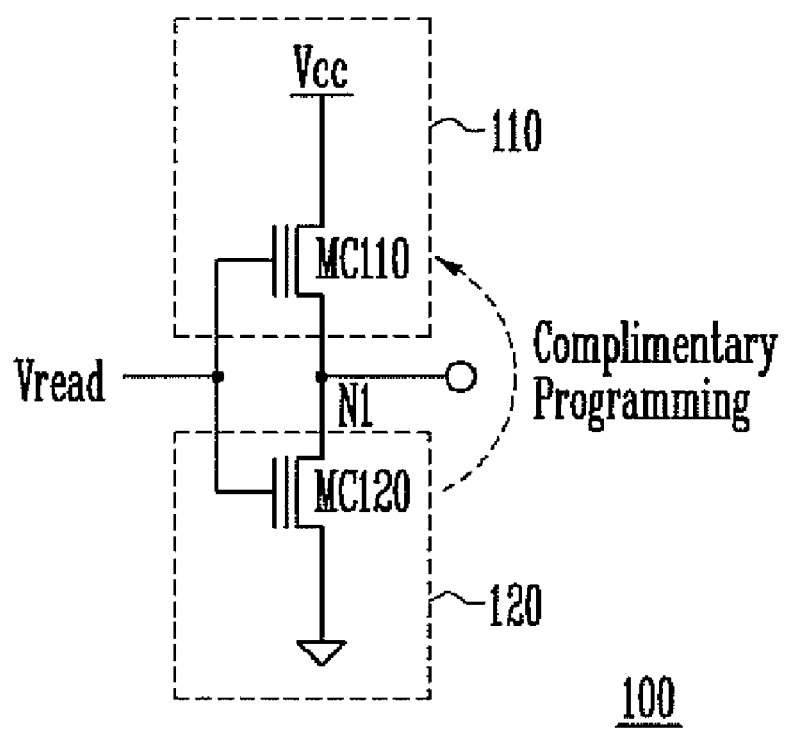
FIGS. 1A and 1B are circuit diagrams of a CAM cell memory device according to an embodiment of this disclosure.
Figure 1A:
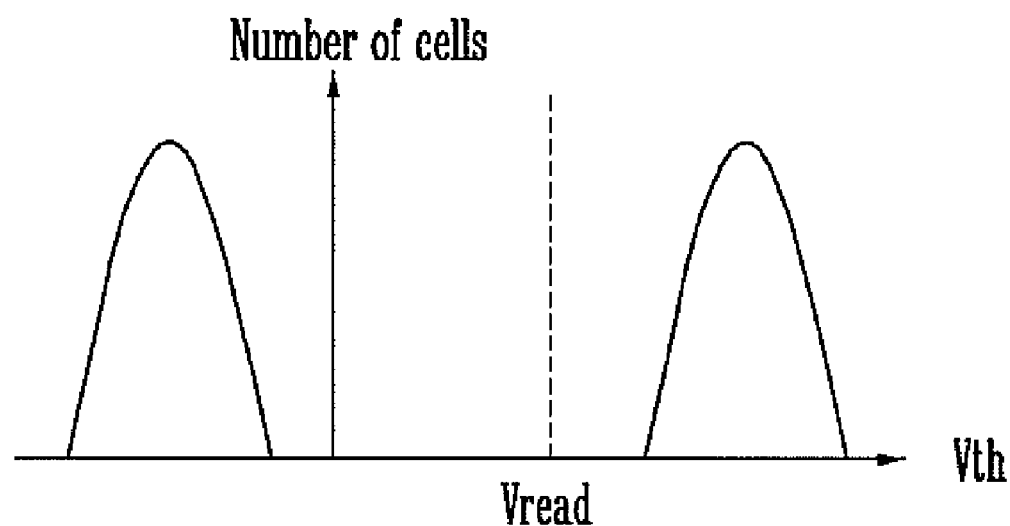
Figure 1B:
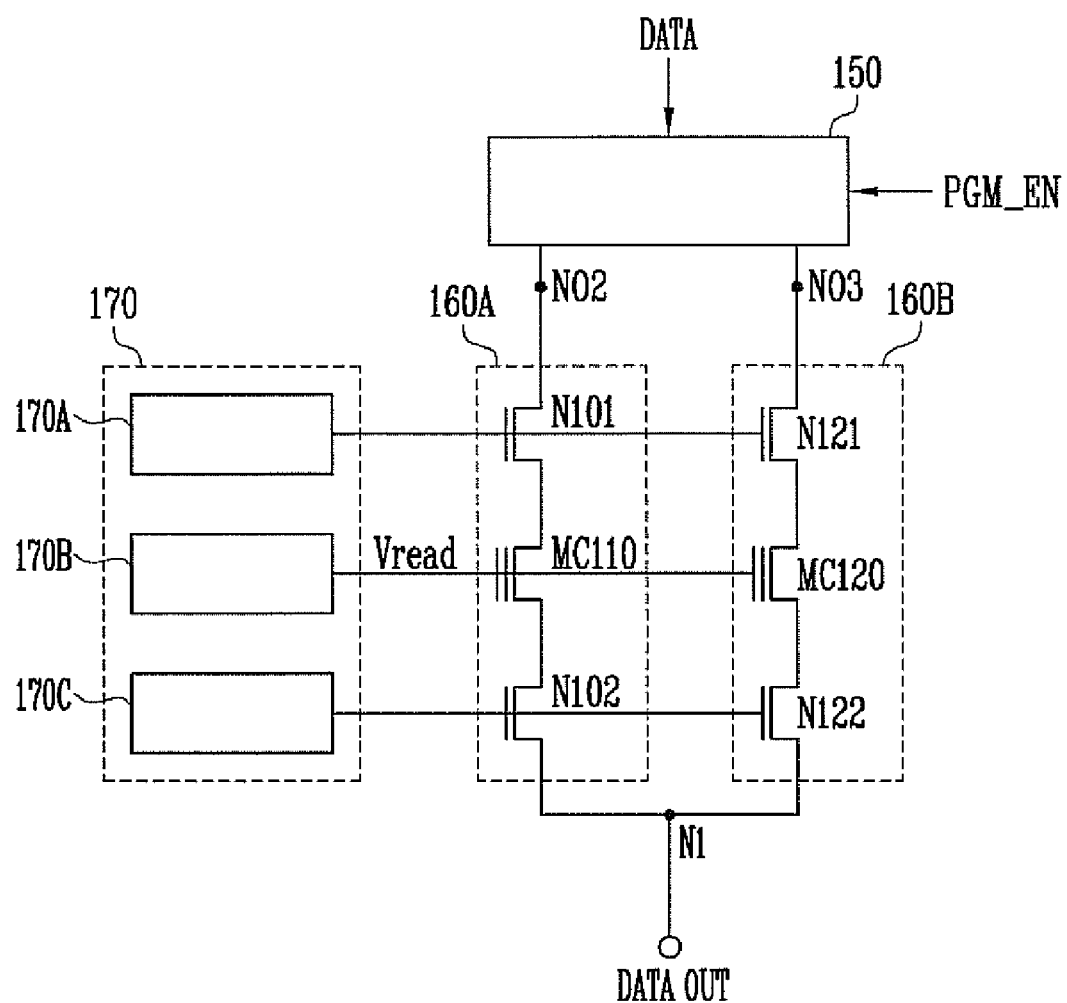

FIGS. 1A and 1B are circuit diagrams of a CAM cell memory device according to an embodiment of this disclosure.

Referring to FIG. 1A, the code address memory (CAM) cell memory device 100 includes a first storage unit 110 and a second storage unit 120. The first storage unit 110 includes a first nonvolatile memory cell MC110 configured to output a power source voltage (Vcc) in response to a read voltage (Vread). The second storage unit 120 includes a second nonvolatile memory cell MC120 configured to output a ground voltage in response to a read voltage (Vread). From a different perspective, the first storage unit 110 is configured to apply the power source voltage (Vcc) to an output node N1 in response to a threshold voltage state of the first nonvolatile memory cell MC110, and the second storage unit 120 is configured to ground the output node N1 in response to a threshold voltage state of the second nonvolatile memory cell MC120.

The first nonvolatile memory cell MC110 is coupled between the power source voltage (Vcc) terminal and the output node N1, and the second nonvolatile memory cell MC120 is coupled between the ground terminal and the output node N1.

The first nonvolatile memory cell MC110 and the second nonvolatile memory cell MC120 have threshold voltages with different states (i.e., opposite states). When the threshold voltage of the first nonvolatile memory cell MC110 is more than a read voltage (Vread) (i.e., a program state (or a turn-off state)), the threshold voltage of the second nonvolatile memory cell MC120 is lower than the read voltage (Vread) (i.e., an erase state (or a turn-on state)). Alternatively, when the first nonvolatile memory cell MC110 is in the erase state, the second nonvolatile memory cell MC120 may be in the program state.

Assuming that the first nonvolatile memory cell MC110 is in the program state and the second nonvolatile memory cell MC120 is in the erase state, when a read voltage (Vread) is applied to the gates of the cells, only the second nonvolatile memory cell MC120 is turned on. Since the threshold voltage of the first nonvolatile memory cell MC110 is more than the read voltage (Vread), the first nonvolatile memory cell MC110 is turned off. Accordingly, the second storage unit 120 operates (turned on), and so the output node N1 becomes a ground state. It is determined that data '0' is stored in the CAM cell memory device 100. That is, the ground voltage is outputted to the output node N1 through the second storage unit 120.

Assuming that the first nonvolatile memory cell MC110 is in the erase state and the second nonvolatile memory cell MC120 is in the program state, when a read voltage (Vread) is applied to the gates of the cells, only the first nonvolatile memory cell MC110 is turned on. Since the threshold voltage of the second nonvolatile memory cell MC120 is more than the read voltage (Vread), the second nonvolatile memory cell MC120 is turned off. Accordingly, the first storage unit 110 is turned on, and so the output node N1 outputs the power source voltage (Vcc). It is determined that data '1' is stored in the CAM cell memory device 100. That is, the power source voltage (Vcc) is outputted to the output node N1 through the first storage unit 110.

As described above, whether the first storage unit 110 or the second storage unit 120 will be turned on is determined according to respective threshold voltage states of the first and second nonvolatile memory cells MC110 and MC120, and stored data and outputted data are determined according to the operations of the first storage unit 110 and the second storage unit 120.

A storage state of the nonvolatile memory cell can be changed by the following circuit.

Referring to FIG. 1B, the CAM cell memory device includes an operation setting unit 150, a first storage unit 160A, a second storage unit 160B, and an operation voltage generation unit 170.

The operation setting unit 150 is configured to output a power source voltage and a ground voltage to corresponding nodes in response to an operation control signal PGM_EN or to output the power source voltage and the ground voltage to corresponding nodes in response to the operation control signal PGM_EN and a data signal DATA. In more detail, the operation setting unit 150 is configured to output a data signal and an inverted data signal to a first node NO2 and a second node NO3, respectively, using the data signal DATA when a program operation is performed or the power source voltage and the ground voltage to the first node NO2 and the second node NO3, respectively, when a read operation is performed, in response to the operation control signal PGM_EN.

The operation setting unit 150 includes a data latch unit and an operation selection unit, and a detailed construction of the operation setting unit 150 is described later with reference to FIG. 2.

The first storage unit 160A includes the first nonvolatile memory cell MC110 configured to output the power source voltage, received from the operation setting unit 150, to the output node N1 in response to the read voltage (Vread). In an embodiment, the first nonvolatile memory cell MC110 is coupled between the first node NO2 and the output node N1 and is set to be in a turn-on state or a turn-off state (an erase state or a program state). In more detail, the first storage unit 160A includes a first select transistor N101, the first nonvolatile memory cell MC110, and a second select transistor N102 coupled in series between the first node NO2 and the output node N1.

The second storage unit 160B includes the second nonvolatile memory cell MC120 configured to output the ground voltage, received from the operation setting unit 150, to the output node N1 in response to the read voltage (Vread). In an embodiment, the second nonvolatile memory cell MC120 is coupled between the second node NO3 and the output node N1 and is set to be in a same state as the state of the first nonvolatile memory cell MC110 or a state opposite to the state of the first nonvolatile memory cell MC110. In more detail, the second storage unit 160B includes a third select transistor N121, the second nonvolatile memory cell MC120, and a fourth select transistor N122 coupled in series between the second node NO3 and the output node N1.

Here, the first nonvolatile memory cell MC110 and the second nonvolatile memory cell MC120 constitute a CAM cell.

The operation voltage generation unit 170 is configured to apply a program voltage or a read voltage to the gates of the first and second nonvolatile memory cells MC110-MC120. The first and second nonvolatile memory cells MC110-MC120 are configured to store data in response to the program voltage supplied from the operation voltage generation unit 170 and the power source voltage and the ground voltage outputted in response to the operation control signal PGM_EN and the data signal DATA and to output data in response to the read voltage supplied from the operation voltage generation unit 170 and the power source voltage and the ground voltage outputted in response to the operation control signal PGM_EN. The operation voltage generation unit 170 includes a first voltage generation unit 170A, a second voltage generation unit 170B, and a third voltage generation unit 170C.

The first voltage generation unit 170A is configured to control the turn-on and turn-off of the first and third select transistors N101, N121. The second voltage generation unit 170B is configured to generate voltages for the program operation or the read operation of the first and second nonvolatile memory cells MC110, MC120. The third voltage generation unit 170C is configured to control the turn-on and turn-off of the second and fourth select transistors N102, N122. In more detail, the third voltage generation unit 170C is configured to turn off the second and fourth select transistors N102, N122 when a program operation for the first and second nonvolatile memory cells MC110, MC120 is performed, and to turn on the second and fourth select transistors N102, N122 when a read operation for the first and second nonvolatile memory cells MC110, MC120 is performed.

The above elements are further described below. The CAM cell memory device of this disclosure can include the first and second nonvolatile memory cells MC110, MC120 and operation control circuits 150, 170. The drains of the first and second nonvolatile memory cells MC110, MC120 are electrically coupled together. The operation control circuits 150, 170 are configured to supply the gates of the first and second nonvolatile memory cells MC110, MC120 with the read voltage or the program voltage, the source of the first nonvolatile memory cell MC110 with the power source voltage or the ground voltage, and the source of the second nonvolatile memory cell MC120 with the ground voltage or the power source voltage in response to the operation control signal PGM_EN. The potentials of the drains of the first and second nonvolatile memory cells MC110, MC120 are determined in response to data stored in the first and second nonvolatile memory cells MC110, MC120 and the power source voltage and the ground voltage supplied to the sources of the first and second nonvolatile memory cells MC110, MC120. A detailed construction of the operation control circuits 150, 170 is described later with reference to FIG. 2.

The operation of the CAM cell memory device is described below with respect to a program operation and a read operation.

Prior to the program operation, the states of the first and second nonvolatile memory cells MC110, MC120 are changed into an erase state (i.e., a turn-on state).

When the program operation starts, the data signal DATA is inputted to the operation setting unit 150, and the operation setting unit 150 outputs the data signal DATA to the first node NO2 and its inverted data signal to the second node NO3 in response to the operation control signal PGM_EN. For example, when data '1' of a logic high level is received, the operation setting unit 150 can output the data signal of the logic high level to the first node NO2 and an inverted data signal of a logic low level to the second node NO3. The first voltage generation unit 170A of the operation voltage generation unit 170 turns on the first and third select transistors N101, N121, and the second voltage generation unit 170B thereof turns off the second and fourth select transistor N102, N122. Accordingly, the channel region of the first nonvolatile memory cell MC110 is precharged, and the ground voltage is applied to the channel region of the second nonvolatile memory cell MC120. Next, the second voltage generation unit 170B applies a program voltage (not shown) to the first and second nonvolatile memory cells MC110, MC120. Accordingly, a channel boosting phenomenon occurs in the channel region of the first nonvolatile memory cell MC110 where the first nonvolatile memory cell MC110 maintains an erase state (i.e., a turn-on state) because a voltage difference between the channel region and the control gate of the first nonvolatile memory cell MC110 is small. Further, the state of the second nonvolatile memory cell MC120 is changed into a program state (i.e., a turn-off state) because a voltage difference between the channel region and the control gate of the channel region is large.

When the read operation starts, the operation setting unit 150 supplies the first node NO2 with the power source voltage and the second node NO3 with the ground voltage. The first to fourth select transistors N101, N102, N121, and N122 are turned on by the first and third voltage generation units 170A, 170C. Consequently, a circuit equivalent to the circuit shown in FIG. 1A is implemented. When the second voltage generation unit 170B outputs the read voltage (Vread), the power source voltage is transferred to the output node N1 via the first storage unit 160A including the first nonvolatile memory cell MC110 (i.e., a turn-on state). Accordingly, data '1' is outputted.

However, when data '0' of a logic low level is received and so the first and second nonvolatile memory cells MC110 and MC120 are programmed, data '0' is outputted to the output node N1 when a read operation is performed.

Data of the CAM cell can be changed and outputted through the above-described method.

In summary, the operation setting unit 150 and the operation voltage generation unit 170 constitute the operation control circuit of the first and second nonvolatile memory cells MC110, MC120. Further, when the operation control circuits 150, 170 turn on the first to fourth select transistors N101, N102, N121, and N122, the drains of the first and second nonvolatile memory cells MC110, MC120 are electrically coupled together, and the electrical coupling point becomes the output node N1.

In other words, when the CAM cell memory device operates, the drains of the first and second nonvolatile memory cells MC110, MC120 are electrically coupled together, and the operation control circuits 150, 170 supply voltages for controlling the operations of the first and second nonvolatile memory cells MC110, MC120. That is, the operation control circuits 150, 170 are configured to supply a program voltage to the first and second nonvolatile memory cells MC110, MC120, the power source voltage (or the ground voltage) to the source of the first nonvolatile memory cell MC110, and the ground voltage (or the power source voltage) to the source of the second nonvolatile memory cell MC120. The threshold voltages of the first and second nonvolatile memory cells MC110, MC120 are changed according to the program voltage supplied from the operation control circuits 150, 170 to the first and second memory cells MC110, MC120 and the power source voltage and the ground voltage supplied to the sources (i.e., the first and second nodes NO2, NO3) of the first and second nonvolatile memory cells MC110, MC120. Alternatively, different data can be stored in the first and second nonvolatile memory cells MC110, MC120.

Furthermore, the operation control circuits 150, 170 are configured to supply a read voltage to the first and second nonvolatile memory cells MC110, MC120, the power source voltage (or the ground voltage) to the source of the first nonvolatile memory cell MC110, and the ground voltage (or the power source voltage) to the source of the second nonvolatile memory cell MC120. The potentials of the drains (i.e., the output node N1) of the first and second nonvolatile memory cells MC110, MC120 are changed according to the read voltage supplied from the operation control circuits 150, 170 to the first and second memory cells MC110, MC120 and the power source voltage and the ground voltage supplied to the sources (i.e., the first and second nodes NO2, NO3) of the first and second nonvolatile memory cells MC110, MC120.

Hereinafter, one of the first storage unit 160A and the second storage unit 160B is referred to as "a first storage unit," and the other of them is referred to as "a second storage unit."

Figure 2:
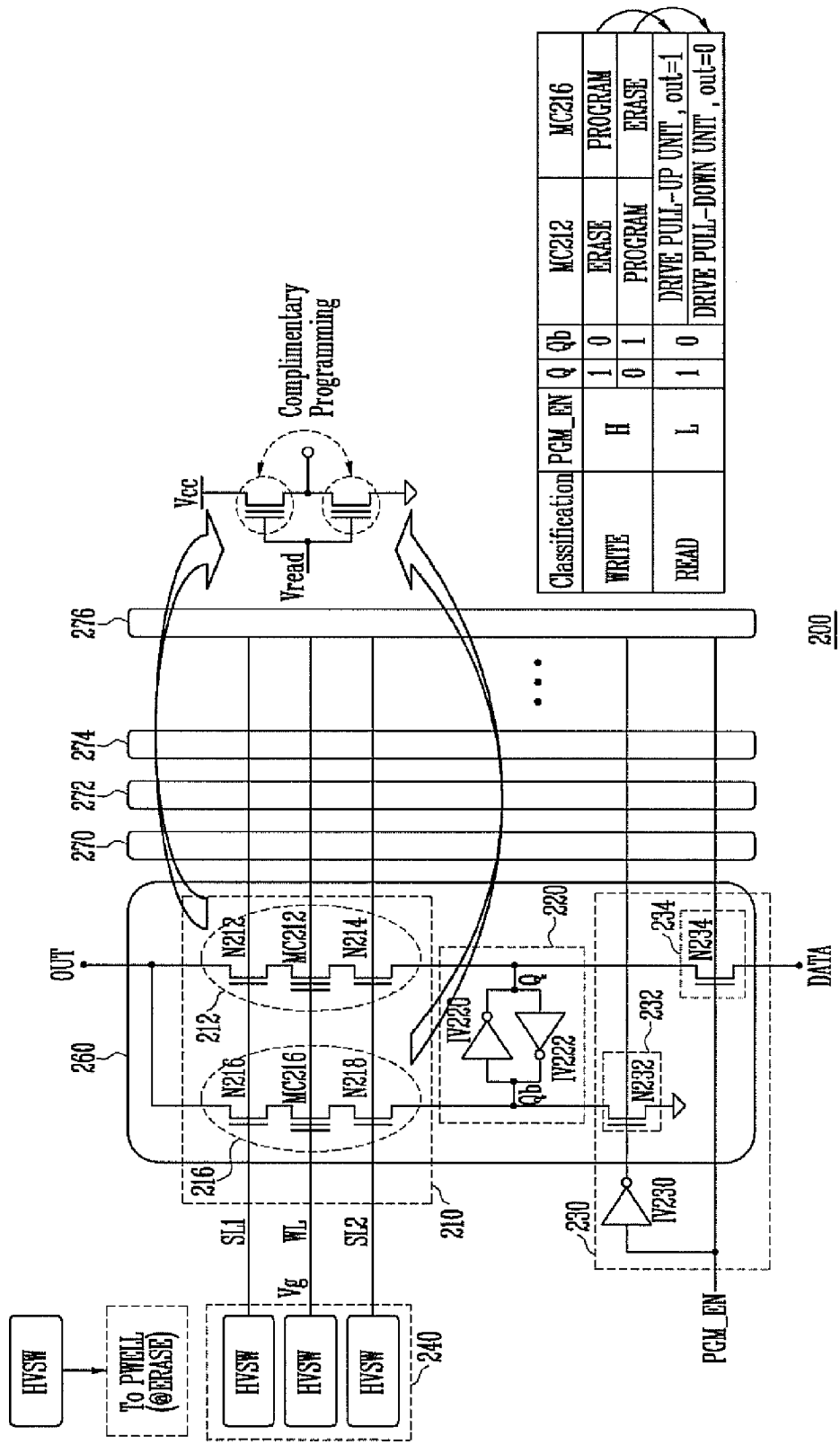
FIG. 2 is a detailed diagram showing the CAM cell memory device according to an embodiment of this disclosure.

FIG. 2 is a detailed diagram showing the CAM cell memory device according to an exemplary embodiment of this disclosure.

The CAM cell memory device 200 includes a plurality of CAM cell memories 260, 270, 272, 274, and 276 configured to share a word line WL and select lines SL1, SL2 and to receive the same operation control signal PGM_EN. The CAM cell memories have the same construction, and thus, only one (e.g., 260) of the CAM cell memories is described below as an example.

The CAM cell memory 260 includes a CAM cell unit 210, a data latch unit 220, an operation selection unit 230, and an operation voltage generation unit 240.

The CAM cell unit 210 includes a first storage unit 212 and a second storage unit 216. The first storage unit 212 is configured to apply a power source voltage to an output node OUT such that data '1' can be outputted in response to a threshold voltage state of a first nonvolatile memory cell MC212. The second storage unit 216 is configured to apply a ground voltage to the output node OUT such that data '0' can be outputted in response to a threshold voltage state of a second nonvolatile memory cell MC216.

The first storage unit 212 includes the first nonvolatile memory cell MC212 selectively coupled between the output node OUT and a first node Q of the data latch unit 220. The first storage unit 212 further includes a first select transistor N212 configured to selectively couple the first nonvolatile memory cell MC212 and the output node OUT together and a second select transistor N214 configured to selectively couple the first nonvolatile memory cell MC212 and the first node Q of the data latch unit 220 together.

The second storage unit 216 includes a first nonvolatile memory cell MC216 selectively coupled between the output node OUT and a second node Qb of the data latch unit 220. The second storage unit 216 further includes a first select transistor N216 configured to selectively couple the first nonvolatile memory cell MC216 and the output node OUT and a second select transistor N218 configured to selectively couple the first nonvolatile memory cell MC216 and the second node Qb of the data latch unit 220 together. The first and second select transistors function to protect the corresponding nonvolatile memory cell from a high voltage.

The data latch unit 220 is coupled with the operation selection unit 230 and is configured to store data to be written into the CAM cell unit 210. The data latch unit 220 is configured to transfer first data to the first storage unit 212 and transfer second data having a logic level opposite to that of the first data to the second storage unit 216. To this end, the data latch unit 220 includes a first inverter IV220 and a second inverter IV222. The output terminal of the first inverter IV220 is coupled with the input terminal of the second inverter IV222, and the output terminal of the second inverter IV222 is coupled with the input terminal of the first inverter IV220. A node at which the output terminal of the first inverter IV220 is coupled with the input terminal of the second inverter IV222 is referred to as "the first node Q," and a node at which the output terminal of the second inverter IV222 is coupled with the input terminal of the first inverter IV220 is referred to as "the second node Qb." Accordingly, data of different levels are outputted to the first node Q and the second node Qb. For example, when data '1' is outputted to the first node Q, data '0' is outputted to the second node Qb. For example, when data '0' is outputted to the first node Q, data '1' is outputted to the second node Qb. In this configuration, when data '0' is transferred to the first storage unit 212 of the CAM cell unit 210, data '1' is transferred to the second storage unit 216. When data '1' is transferred to the first storage unit 212 of the CAM cell unit 210, data '0' is transferred to the second storage unit 216.

The operation selection unit 230 is coupled with the data latch unit 220 and the CAM cell unit 210 and is configured to supply them with a predetermined voltage (e.g., the ground voltage) when a read operation is performed and with a data signal DATA when a program operation is performed. For reference, the data latch unit 220 is configured to output the power source voltage and the ground voltage to the first and second nodes Q, Qb in response to the predetermined voltage outputted from the operation selection unit 230. Furthermore, the data latch unit 220 is configured to output the data signal and an inverted data signal to the first and second nodes Q, Qb in response to the data signal outputted from the operation selection unit 230.

The operation selection unit 230 includes a data input unit 234, a voltage supply unit 232, and an inverter IV230. The data input unit 234 is configured to couple a data input terminal DATA and the first node Q and the first storage unit 212 of the CAM cell unit 210 together in response to the operation control signal PGM_EN of a logic high level when the program operation is performed. The voltage supply unit 232 is configured to couple a ground terminal and the second node Qb and the second storage unit 216 of the CAM cell unit 210 in response to the operation control signal PGM_EN of a logic low level when the read operation is performed. The inverter IV230 is configured to invert the operation control signal PGM_EN and supply an inverted operation control signal PGM_EN to the voltage supply unit 232.

The voltage supply unit 232 includes an NMOS transistor N232 coupled between the ground terminal, and the second node Qb and the second storage unit 216 of the CAM cell unit 210 and turned on in response to the inverted operation control signal PGM_EN. Accordingly, when the operation control signal PGM_EN of a logic low level is received, the NMOS transistor N232 is turned on, and so the second node Qb is grounded. That is, the ground voltage is applied to the second storage unit 216. Meanwhile, since the second node Qb is in the ground state, the power source voltage is supplied to the first node Q. In response thereto, the power source voltage is supplied to the first storage unit 212. In other words, when the read operation is performed, the voltage supply unit 232 supplies the first storage unit 212 with the power source voltage and the second storage unit 216 with the ground voltage.

The data input unit 234 includes an NMOS transistor N234 coupled between the data input terminal DATA, and the first node Q and the first storage unit 212 of the CAM cell unit 210 and turned on in response to the operation control signal PGM_EN. Accordingly, when the operation control signal PGM_EN of a logic high level is received, the NMOS transistor N234 is turned on, and so input data is transferred to the first node Q. Data stored in the first node Q is determined according to data inputted through the data input terminal DATA.

The operation of the CAM cell memory device is described below.

First, a program operation for writing data is described.

Prior to the program operation, all of the CAM cell memories are in an erase state. That is, the threshold voltages of the CAM cell memories are small (for example, less than 0 V). The program operation is identical with the program operation of a conventional nonvolatile memory cell. When a channel voltage of the nonvolatile memory cell is 0 V, the threshold voltage of the cell rises when a program voltage is applied to the gate of the cell. Meanwhile, when a channel voltage of the nonvolatile memory cell is a power source voltage, the threshold voltage of the cell remains intact irrespective of a program voltage applied to the gate of the cell.

When the operation control signal PGM_EN of a logic high level is received, the data input unit 234 is actuated. In response thereto, input data is stored in the first node Q and the second node Qb. The states of the input data stored in the first node Q and the second node Qb are complementary. That is, when the input data is data '1', data '1' is stored in the first node Q, and data '0' is stored in the second node Qb. Meanwhile, when the input data is data '0', data '0' is stored in the first node Q, and data '1' is stored in the second node Qb. Furthermore, the select transistors N214, N218 of the CAM cell unit are turned on in response to the operation control signal PGM_EN of a logic high level. Here, the select transistors N214, N218 coupled with the output node OUT are turned off in order to prevent the occurrence of the leakage current.

In the case where data '0' is stored in the first node Q, the ground voltage is stored in the first node Q and the power source voltage is stored in the second node Qb. Accordingly, a channel voltage of the memory cell MC212 of the first storage unit 212 coupled with the first node Q becomes 0 V, and a channel voltage of the memory cell MC216 of the second storage unit 216 coupled with the second node Qb becomes the power source voltage. Thus, although a high program voltage is applied through the word line WL, only the threshold voltage of the memory cell MC212 of the first storage unit 212 rises to 0 V or more, but the threshold voltage of the memory cell MC216 of the second storage unit 216 is maintained to be small (for example, less than 0 V).

Meanwhile, in the case where data '1' is stored in the first node Q, according to the same principle described above, a channel voltage of the memory cell MC212 of the first storage unit 212 coupled with the first node Q becomes the power source voltage, and the channel voltage of the memory cell MC216 of the second storage unit 216 coupled with the second node Qb becomes 0 V. Thus, although a high program voltage is applied through the word line WL, only the threshold voltage of the memory cell MC216 of the second storage unit 216 rises to 0 V or more, but the threshold voltage of the memory cell MC212 of the first storage unit 212 is maintained to be small (for example, less than 0 V).

A read operation of reading data is below described below.

When the operation control signal PGM_EN of a logic low level is received, the operation selection unit 232 is actuated. In response thereto, the ground voltage is transferred to the second storage unit 216, and the power source voltage is transferred to the first storage unit 212.

Here, a reference voltage (Vread) is applied to the gates of the nonvolatile memory cells. For example, 0 V can be used as the reference voltage (Vread). Alternatively, a voltage greater than 0 V can be used as the reference voltage (Vread). That is, any voltage that can distinguish two different distributions from each other according to the distribution shown in FIG. 1 can be used as the reference voltage (Vread).

Meanwhile, the threshold voltage of the memory cell MC212 of the first storage unit 212 may rise to 0 V or higher due to the program operation, or the threshold voltage of the memory cell MC216 of the second storage unit 216 may rise to 0 V or higher. The threshold voltages of the memory cell MC212 and the memory cell MC216 rarely have the same state, and have opposite states mostly.

If the threshold voltage of the memory cell MC212 of the first storage unit 212 has risen to the reference voltage (Vread) or higher (i.e., a program state), the threshold voltage of the memory cell MC216 of the second storage unit 216 is less than the reference voltage (Vread) (i.e., an erase state). In this case, if the reference voltage (Vread) is applied to the gates of the memory cells MC212, MC216, only the memory cell MC216 of the second storage unit 216 (i.e., the erase state) is turned on. That is, the second storage unit 216 is turned on, and so the ground voltage is outputted. Accordingly, it is determined that data '0' has been stored in the CAM cell unit 210.

Meanwhile, if the threshold voltage of the memory cell MC212 of the first storage unit 212 is less than the reference voltage (Vread) (i.e., the erase state), the threshold voltage of the memory cell MC216 of the second storage unit 216 is higher than the reference voltage (Vread) (i.e., the program state). Here, if the reference voltage (Vread) is applied to the gates of the memory cells, only the memory cell MC212 of the first storage unit 212 (i.e., the erase state) is turned on. That is, the first storage unit 212 is turned on, and so the power source voltage is outputted. Accordingly, it is determined that data '1' has been stored in the CAM cell unit 210.

As described above, data can be outputted by applying a reference voltage to the gate of the memory cell in a read operation. In particular, since 0 V can be applied as the reference voltage, power consumption for the read operation can be minimized. Furthermore, the number of peripheral circuits for program and read operations can be reduced.

Figure 3:
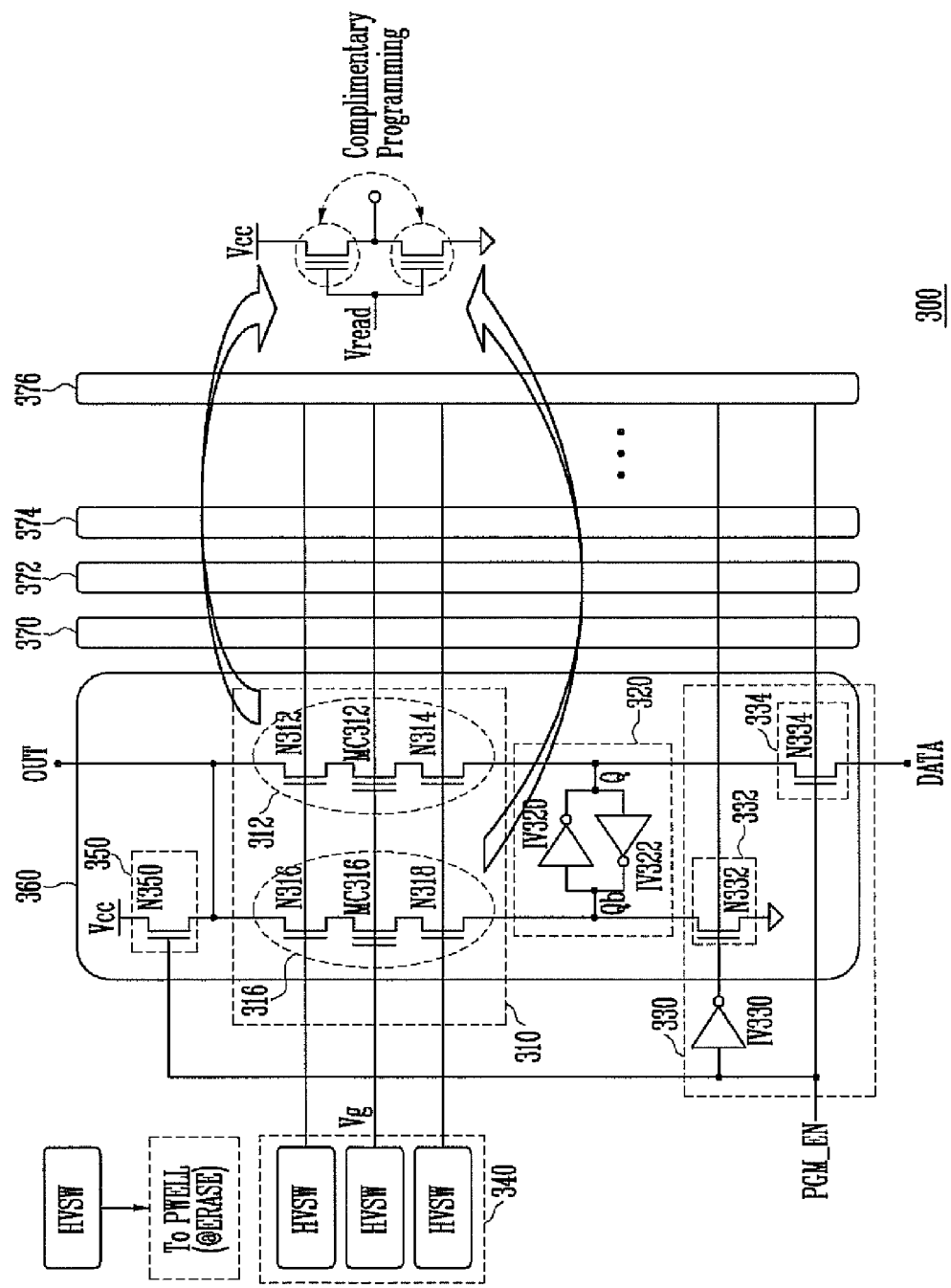
FIG. 3 is a diagram showing a CAM cell memory device according to another embodiment of this disclosure.

FIG. 3 is a diagram showing a CAM cell memory device according to another embodiment of this disclosure.

The CAM cell memory device 300 includes a plurality of CAM cell memories 360, 370, 372, 374, and 376 configured to share a word line WL and select lines SL1, SL2 and to receive the same operation control signal PGM_EN.

The CAM cell memories have the same construction, and thus, only one (e.g., 360) of the CAM cell memories is described as an example.

The CAM cell memory 360 includes a CAM cell unit 310, a data latch unit 320, an operation selection unit 330, a high voltage generation unit 340, and an output node precharge unit 350. The CAM cell memory 360 has the same construction as the CAM cell memory 260 of FIG. 2, and so only the output node precharge unit 350 is described for simplicity.

The output node precharge unit 350 includes an NMOS transistor N350 turned on in response to an operation control signal PGM_EN and configured to supply an output node OUT with a power source voltage (Vcc). In an alternative embodiment, the output node precharge unit 350 can include a PMOS transistor which is turned on in response to an inverted operation control signal PGM_EN outputted from the inverter IV330 of the operation selection unit 330 and configured to supply the output node OUT with the power source voltage (Vcc). In both embodiments, when the operation control signal PGM_EN of a logic high level is applied (i.e., when a program operation is performed), an operation for precharging the output node OUT with a logic high level is performed. Thus, the occurrence of the leakage current through the output node OUT can be prevented/reduced when the program operation is performed. In this case, select transistors N312, N316 coupled with the output node OUT are turned off. As described above, while the program operation is performed, the output node OUT is precharged with a logic high level. Accordingly, the leakage current can be prevented from occurring through the output node OUT when the program operation is performed.

According to this disclosure, there is provided a CAM cell memory device that enables stable data output even in a power-up operation. Further, an additional verification operation is not required when a write operation is performed. Furthermore, a read operation can be performed by applying a reference voltage to the gates of memory cells without an additional read operation. In particular, although a reference voltage of, for example, 0 V is applied, a read operation can be performed. Accordingly, the number of peripheral circuits can be minimized and power consumption and the area for the peripheral circuits can be reduced because program and read operations are simplified.

What is claimed is:
1. A code address memory (CAM) cell memory device, comprising:
a first storage unit comprising a first nonvolatile memory cell configured to output a power source voltage in response to a read voltage; and a second storage unit comprising a second nonvolatile memory cell configured to output a ground voltage in response to the read voltage.

2. The CAM cell memory device of claim 1, wherein:
one of threshold voltages of the first and second nonvolatile memory cells is 0 V or higher,
the other of the threshold voltages of the first and second nonvolatile memory cells is less than 0 V, and
the first and second storage units are configured to respond to the read voltage of 0 V applied to the first and second nonvolatile memory cells.

3. A CAM cell memory device, comprising:
an operation setting unit configured to output a power source voltage and a ground voltage in response to an operation control signal or in response to the operation control signal and a data signal;
a first storage unit including a first nonvolatile memory cell configured to output the power source voltage to an output node in response to a read voltage;
a second storage unit including a second nonvolatile memory cell configured to output the ground voltage to the output node in response to the read voltage; and
an operation voltage generation unit configured to apply a program voltage or the read voltage to gates of the first and second nonvolatile memory cells,
wherein the first and second nonvolatile memory cells are configured to store data according to the program voltage, and the power source voltage and the ground voltage outputted in response to the operation control signal and the data signal and to output the stored data according to the read voltage, and the power source voltage and the ground voltage outputted in response to the operation control signal.

4. The CAM cell memory device of claim 3, wherein the operation setting unit comprises:
an operation selection unit configured to output the data signal to a first node or the ground voltage to a second node in response to the operation control signal; and
a data latch unit configured to output an inverted data signal to the second node in response to the data signal outputted to the first node or the power source voltage applied to the first node in response to the ground voltage outputted to the second node.

5. The CAM cell memory device of claim 4, wherein the operation selection unit comprises:
an inverter configured to invert the operation control signal and output an inverted operation control signal;
a data input unit coupled between an input terminal of the data signal and a first input terminal of the data latch unit coupled with the first node and turned on in response to the operation control signal; and
a voltage supply unit coupled between a ground voltage terminal and a second input terminal of the data latch unit coupled with the second node and turned on in response to an inverse of the operation control signal.

6. The CAM cell memory device of claim 3, wherein:
the first storage unit comprises a first select transistor, the first nonvolatile memory cell, and a second select transistor coupled in series between the first node and the output node, and
the second storage unit comprises a third select transistor, the second nonvolatile memory cell, and a fourth select transistor coupled in series between the second node and the output node.

7. The CAM cell memory device of claim 6, wherein the operation voltage generation unit comprises:

a first voltage generation unit configured to control turn-on and turn-off of the first and third select transistors;
a second voltage generation unit configured to generate the program voltage or the read voltage inputted to the first and second nonvolatile memory cells; and
a third voltage generation unit configured to control turn-on and turn-off of the second and fourth select transistor.

8. A CAM cell memory device, comprising:
an operation selection unit configured to output a data signal when a program operation is performed and output a predetermined voltage when a read operation is performed, in response to an operation control signal;
a data latch unit configured to output the data signal and an inverted data signal to first and second nodes in response to the data signal and to output a power source voltage and a ground voltage to the first and second nodes in response to the predetermined voltage; and
a CAM cell unit including a first storage unit and a second storage unit, wherein the first storage unit is coupled between the first node and an output node and includes a first nonvolatile memory cell, and the second storage unit is coupled between the second node and the output node and includes a second nonvolatile memory cell,
wherein the first and second nonvolatile memory cells have threshold voltages that vary in response to the data signal and the inverted data signal when the program operation is performed.

9. The CAM cell memory device of claim 8, wherein after the program operation is performed, one of threshold voltages of the first and second nonvolatile memory cells is maintained to be 0 V or more, and the other of the threshold voltages of the first and second nonvolatile memory cells is maintained to be less than 0 V.

10. The CAM cell memory device of claim 8, wherein:
the first storage unit comprises a first select transistor configured to selectively couple the first nonvolatile memory cell with the output node and a second select transistor configured to selectively couple the first nonvolatile memory cell with the first node, and
the second storage unit comprises a first select transistor configured to selectively couple the second nonvolatile memory cell with the output node and a second select transistor configured to selectively couple the second nonvolatile memory cell with the second node.

11. The CAM cell memory device of claim 8, wherein the operation selection unit comprises:
a data input unit configured to couple a data input terminal with the first node in response to the operation control signal when the program operation is performed, and
a voltage supply unit configured to couple a ground voltage terminal with the second node in response to an inverse of the operation control signal when the read operation is performed.

12. The CAM cell memory device of claim 11, wherein the operation selection unit further comprises an inverter configured to invert the operation control signal and output the inverted operation control signal.

13. The CAM cell memory device of claim 8, wherein:
the data latch unit comprises a first inverter and a second inverter, and
an input terminal of the first inverter is coupled with an output terminal of the second inverter, and an input terminal of the second inverter is coupled with an output terminal of the first inverter.

14. The CAM cell memory device of claim 8, wherein during the program operation, when the data signal of a logic high level is inputted, the threshold voltage of the second nonvolatile memory cell of the second storage unit is configured to rise to a reference voltage or higher, and when the data signal of a logic low level is inputted, the threshold voltage of the first nonvolatile memory cell of the first storage unit is configured to rise to a reference voltage or higher.

15. The CAM cell memory device of claim 8, wherein in the case where the threshold voltage of the first nonvolatile memory cell is set to be a reference voltage or higher and the threshold voltage of the second nonvolatile memory cell is set to be less than the reference voltage, when the read operation is performed, the second nonvolatile memory cell is turned on in response to a read voltage applied to gates of the first and second nonvolatile memory cells, and the ground voltage is outputted to the output node.

16. The CAM cell memory device of claim 8, wherein in the case where the threshold voltage of the first nonvolatile memory cell is set to be less than a reference voltage and the threshold voltage of the second nonvolatile memory cell is set to be the reference voltage or higher, when the read operation is performed, the first nonvolatile memory cell is configured to be turned on in response to a read voltage applied to gates of the first and second nonvolatile memory cells, and the power source voltage is configured to be outputted to the output node.

17. The CAM cell memory device of claim 8, further comprising an output node precharge unit configured to precharge the output node with a logic high level when the program operation is performed.

18. The CAM cell memory device of claim 17, wherein the output node precharge unit comprises an NMOS transistor configured to be turned on in response to the operation control signal of a logic high level and configured to supply the output node with the power source voltage.

19. A CAM cell memory device, comprising:
first and second nonvolatile memory cells with drains electrically coupled together; and
an operation control circuit configured to apply a read voltage or a program voltage to gates of the first and second nonvolatile memory cells, a power source voltage or a ground voltage to a source of the first nonvolatile memory cell, and a ground voltage or a power source voltage to a source of the second nonvolatile memory cell, in response to an operation control signal,
wherein potentials of the drains of the first and second nonvolatile memory cells are configured to be determined in response to data stored in the first and second nonvolatile memory cells and the power source voltage and the ground voltage applied to the sources of the first and second nonvolatile memory cells.

20. The CAM cell memory device of claim 19, wherein the operation control circuit comprises:
an operation selection unit configured to output the ground voltage or a data signal in response to the operation control signal;
a data latch unit configured to output the power source voltage and the ground voltage supplied to the sources of the first and second nonvolatile memory cells in response to the ground voltage outputted from the operation selection unit or to output the power source voltage and the ground voltage supplied to the sources of the first and second nonvolatile memory cells in response to the data signal; and
an operation voltage generation unit configured to output the program voltage or the read voltage such that the data is stored in the first and second nonvolatile memory cells in response to a power source voltage and a ground voltage outputted in response to the data signal or such that potentials of the drains of the first and second nonvolatile memory cells are determined in response to a power source voltage and a ground voltage outputted in response to the ground voltage.

21. The CAM cell memory device of claim 20, wherein the operation selection unit comprises:
a data input unit configured to transfer the data in response to the operation control signal;
an inverter configured to output an inverted operation control signal in response to the operation control signal; and
a voltage supply unit configured to transfer the ground voltage in response to the inverted operation control signal.

22. The CAM cell memory device of claim 20, wherein the operation control circuit further comprises:
first connection elements configured to couple the drains of the first and second nonvolatile memory cells; and
second connection elements configured to transfer the power source voltage and the ground voltage to the sources of the first and second nonvolatile memory cells,
wherein while the data is stored in the first and second nonvolatile memory cells, the operation voltage generation unit is configured to prevent the first connection elements from coupling the drains of the first and second nonvolatile memory cells together.

* * * * *